United States Patent [19]

Jolly et al.

[11] 4,316,430

[45] Feb. 23, 1982

[54] VAPOR PHASE DEPOSITION APPARATUS

[75] Inventors: Stuart T. Jolly, Yardley, Pa.; John P. Paczkowski, Kingston, N.J.

[73] Assignee: RCA Corporation, New York, N.Y.

[21] Appl. No.: 192,476

[22] Filed: Sep. 30, 1980

[51] Int. Cl.³ ............................................. C23C 13/08
[52] U.S. Cl. .................................... 118/725; 118/729; 118/733
[58] Field of Search ............... 118/715, 719, 725, 728, 118/729, 733; 427/250, 248.1, 255.2; 148/175

[56] References Cited

U.S. PATENT DOCUMENTS

| | | | |
|---|---|---|---|
| 3,310,425 | 3/1967 | Goldsmith | 148/175 X |
| 3,361,600 | 1/1968 | Reisman et al. | 148/175 |
| 3,394,390 | 7/1968 | Cheney | 148/175 X |
| 3,493,220 | 3/1970 | Kagdis et al. | 118/725 X |
| 3,600,242 | 8/1971 | Berkenblit et al. | 148/175 |
| 3,675,619 | 7/1972 | Burd | 118/730 X |
| 3,701,682 | 10/1972 | Gartman et al. | 148/175 X |
| 3,716,405 | 2/1973 | Mahn-Jick Lim | 148/174 X |
| 3,828,722 | 8/1974 | Reuter et al. | 118/725 |
| 4,116,733 | 9/1978 | Olsen et al. | 148/175 |
| 4,129,090 | 12/1978 | Inaniwa et al. | 118/728 |

Primary Examiner—John D. Smith
Assistant Examiner—Bernard F. Plantz
Attorney, Agent, or Firm—Birgit E. Morris; Donald S. Cohen; Kenneth R. Glick

[57] ABSTRACT

A vapor phase deposition apparatus includes a coaxially mounted reactor tube, jacketed assembly tube, bearing/plug assembly, and rod/substrate holder. Gas inlets are provided in the reactor tube, and assembly tube and a vent is provided on the jacketed portion of the assembly tube, such that a double counterflow gas pattern can be established in the apparatus. The apparatus permits controllable deposition cycle and it can be readily disassembled for periodic maintenance.

10 Claims, 4 Drawing Figures

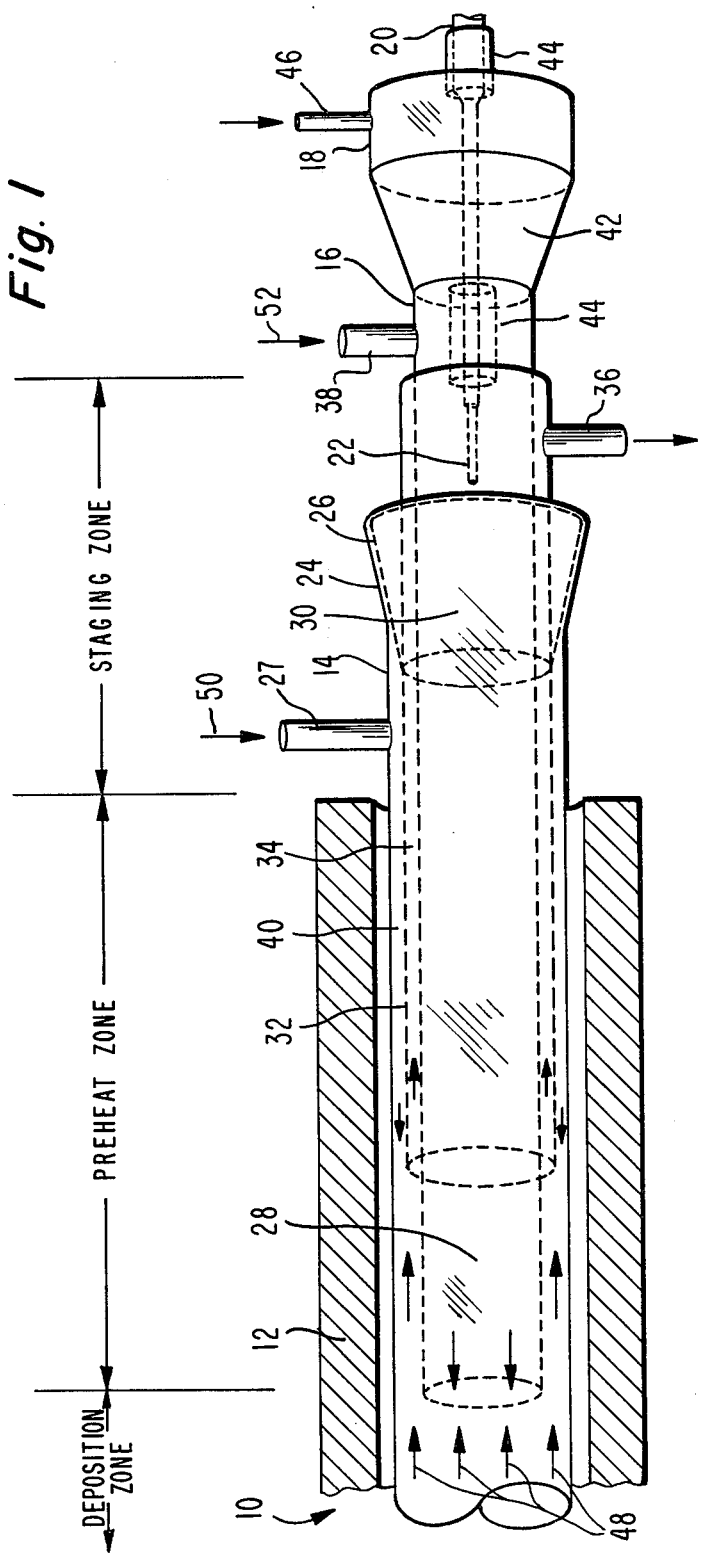

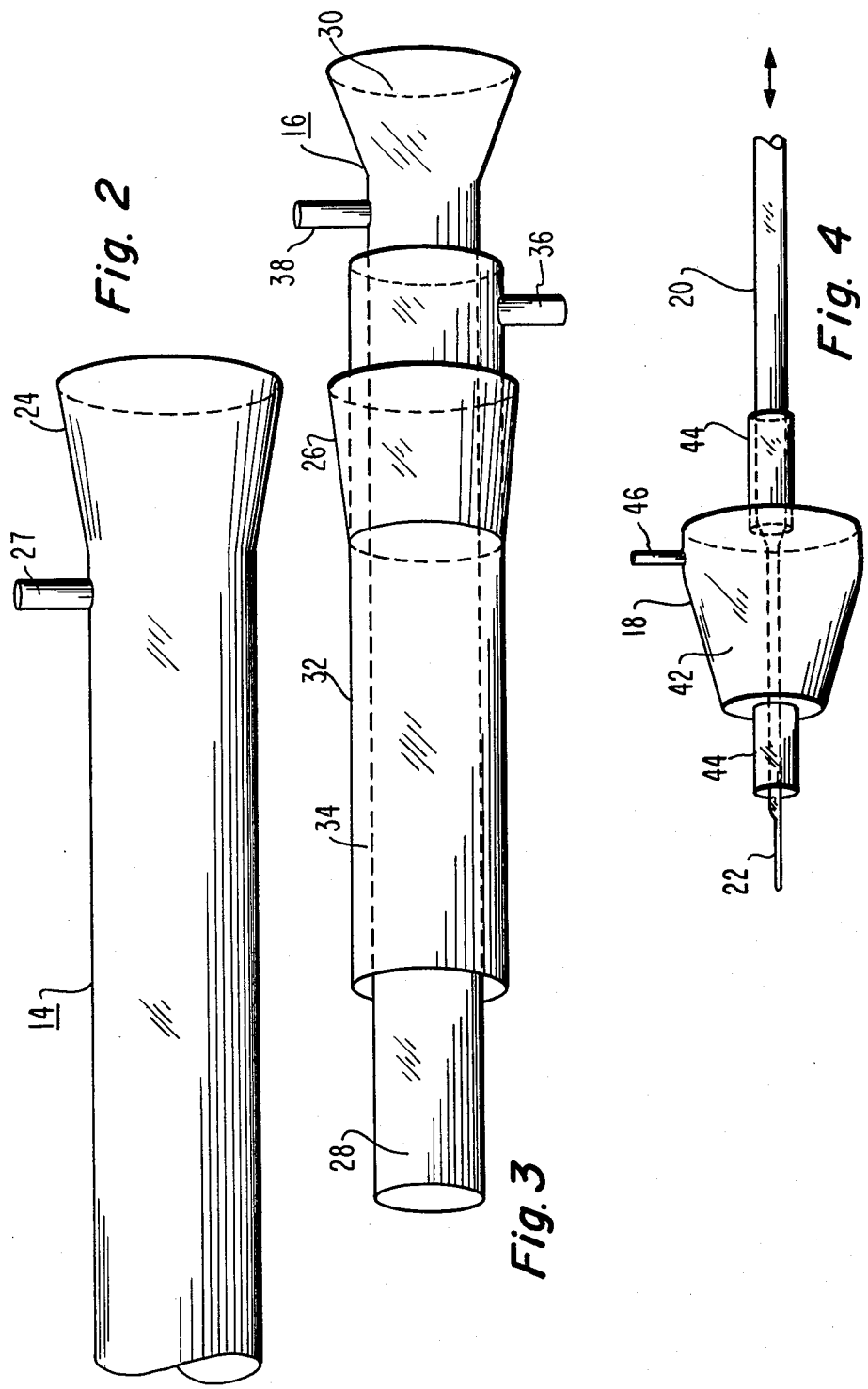

VAPOR PHASE DEPOSITION APPARATUS

The U.S. Government has rights in this invention pursuant to Contract No. 79-6352.

The present invention relates to apparatus for depositing material from the vapor phase onto a substrate. More particularly, it relates to a vapor phase deposition apparatus in which an epitaxial film can be grown on a crystalline semiconductor substrate.

BACKGROUND OF THE INVENTION

A conventional configuration for a deposition reactor is an open-ended, substantially tube-shaped chamber, a portion of which is mounted within a furnace. In a deposition process, a substrate is placed in a heated portion of the reactor and appropriate reactant gases are introduced to the reactor such that they pass over the substrate. For example, to deposit an epitaxial layer of GaAs on a GaAs substrate, the reactant gases contain GaCl and $AsH_3$, and the substrate is heated to about 700° C. Additionally, controlled amounts of impurities may be introduced during the deposition, for example, so as to form N or P doping in the epitaxial film.

A common objective of an epitaxial growth process is the formation of a single crystalline film having either a high purity or a highly controlled concentration of impurities. However, this requires a carefully controlled deposition sequence and a relatively low level of contamination. A common source of contamination is the material which was deposited on the tube walls in prior deposition sequences.

For example, following the deposition of a relatively heavily doped film, a stringent cleaning of the reactor tube is necessary before a lightly doped or high purity film can be grown. The portion of the tube surrounded by the furnace is conventionally cleaned by pushing HCl vapor through the tube while heating at about 700°–900° C. The unheated portions of the reactor tube, however, are not cleaned by this process and can remain a source of contamination in future depositions. Satisfactory cleaning of the unheated portions is generally accomplished by disassembly of the reactor tube from the furnace so that the contaminated parts can be immersed in an appropriate etching solution. In conventional deposition apparatus this represents a relatively inefficient, time-consuming procedure.

SUMMARY OF THE INVENTION

A jacketed assembly tube having open ends is provided for use with a reactor tube. The assembly tube is movable to a position which is coaxial within the reactor tube such that when it is in the coaxial position a first end of the assembly tube is within the heated portion of the reactor tube and a second end of the assembly tube extends from an open end of the reactor tube. The assembly tube is spaced from the reactor tube so as to form a channel of annular cross section between the tubes. Means are provided for sealing the channel in proximity to the open end of the reactor tube and a gas inlet, in proximity to the open end of the reactor tube, provides a passage to the channel. A second gas inlet provides passage to a central portion of the assembly tube, and a vent provides passage to the jacketed portion of the assembly tube near the second end of the assembly tube. A bearing/plug assembly seals the second end of the assembly tube, and a rod is slidably mounted within the bearing/plug assembly. A substrate holder is located on the end of the rod such that the substrate holder is movable from a position near the first end of the assembly tube to a position within the heated portion of the reactor tube.

BRIEF DESCRIPTION OF THE DRAWINGS

FIG. 1 is a perspective view, partially in section, of a deposition apparatus of the present invention.

FIG. 2 is a perspective view of a reactor tube of the present invention.

FIG. 3 is a perspective view of an assembly tube of the present invention.

FIG. 4 is a perspective view of a bearing/plug assembly of the present invention.

DETAILED DESCRIPTION

The illustration of FIG. 1 is a perspective view, partially in section, of a vapor phase deposition apparatus 10 of the present invention. Broken lines represent internal portions of the apparatus. The major components of the apparatus 10 are a furnace 12, a reactor tube 14, an assembly tube 16, a bearing/plug assembly 18, and a rod having a substrate holder 22 on the end thereof. Separate views of the reactor tube 14, assembly tube 16 and bearing/plug assembly 18 are illustrated in FIGS. 2, 3 and 4 respectively.

A portion of the reactor tube 14 is surrounded by heating means, which in the preferred embodiment is the furnace 12, and the reactor tube has an open end 24 extending beyond the furnace. In the preferred embodiment, the open end 24 is flared so as to mate with a plug 26 disposed on the assembly tube 16. A reactor tube gas inlet 27 provides a passage to the interior of the reactor tube 14, and in the preferred embodiment it is disposed outside the furnace 12 and proximate to the open end 24 of the reactor tube.

The assembly tube 16, as illustrated in FIG. 3, has first and second open ends, 28 and 30 respectively. A jacket 32 coaxially surrounds the assembly tube and extends from a portion near the first end 28 to a portion near the second end 30. The jacket 32 is spaced from the assembly tube 16 so as to form a jacket passageway 34 of annular cross section which exits near the first end 28 of the assembly tube. The jacket 32 is sealed to the assembly tube near the second end 30 of the assembly tube 16. The plug 26 coaxially surrounds the jacket 32 near the second end 30 of the assembly tube, a vent 36 communicates with the jacket passageway 34, and a gas inlet 38 communicates with the interior of the assembly tube 16 between the plug and second end of the assembly tube. In the preferred embodiment, the second end 30 of the assembly tube 16 is flared.

When the assembly tube 16 is moved to a position coaxial within the reactor tube 14, as illustrated in FIG. 1, the first end 28 of the assembly tube is within the furnace 12 and the second end 30 of the assembly tube extends beyond the open end 24 of the reactor tube. Additionally, the outside diameter of the jacket 32 and the inside diameter of the reactor tube 14 are such that a reactor/assembly tube channel 40, of annular cross section, is formed when the two components are coaxially mounted. The previously described reactor tube gas inlet 27 provides a passage to the reactor/assembly tube channel 40 and the reactor/assembly tube channel is sealed near the open end of the reactor tube by the plug 26.

The bearing/plug assembly 18, illustrated in FIGS. 1 and 4, is coaxially mountable within the flared second end 30 of the assembly tube 16 so as to seal the second end. The assembly 18 includes a hollow, substantially frustum shaped plug 42 and a pair of gas bearings 44, each bearing extending from a base of the plug along the axis of the frustum. A gas inlet 46 provides a passage to the interior of the plug 42, and the bearings are substantially hollow tubes, such that gas introduced through the inlet 46 exits through the bearings. The rod 20, having the substrate holder 22 on an end thereof, is slidably mounted through the pair of bearings 44. The diameter of the rod should be such that when it is moved to a position where the substrate holder is within the heated portion of the furnace, the rod is supported by the gas exiting through the bearings 44. In the preferred embodiment, the diameter of the rod necks down near the substrate holder 22, such that any deposition which occurs on the rod near the substrate holder will not impair withdrawal of the rod through the bearings.

As illustrated in FIG. 1, the rod 20 is slidable through the bearings 44 so as to move a substrate on the substrate holder 22 from a staging zone, through a preheat zone, to a deposition zone. The staging zone is that portion of the reactor tube 14 and assembly tube 16 which extend beyond the furnace 12. The preheat zone is that portion of the apparatus 10 extending from the staging zone to the first end 28 of the assembly tube 16. The deposition zone is that portion of the reactor tube 14 within the furnace 12 and beyond the second end 30 of the assembly tube.

In a deposition cycle, reactant gases represented by arrows 48 flow through the deposition zone towards the open end of the reactor tube and are exhausted through the passageway 34 and vent 36. Counter flowing gases represented by arrows 50 and 52 are introduced, respectively through the inlets 27 and 38 so as to produce a flow opposite to the reactant gases in both the reactor-/assembly tube channel 40 and through the central portion of the assembly tube 16. In the preferred mode of operation, the flow rates of the counterflowing gases are adjusted so that all reactant gases and decomposition products are forced to pass through the jacket passageway 34 and vent 36. In a deposition cycle for growing substantially pure epitaxial gallium arsenide, the reactant gases include a source of gallium, such as GaCl, and a source of arsenic, such as AsH$_3$. The counterflowing gases 50 and 52 can be relatively pure and inert palladium-diffused hydrogen.

In a typical operating sequence, a substrate is placed on the substrate holder 22 and remains in the staging zone while the various gases are allowed to reach equilibrium composition and temperature. After equilibrium is reached, the substrate is moved into the preheat zone by sliding the rod 20 an appropriate distance. Within the preheat zone the substrate can be heated to deposition temperature in an atmosphere which is controlled by the composition of the counterflowing gas 52. This atmosphere might typically be relatively inert, such as hydrogen. Alternatively, when the substrate material includes a volatile constituent the atmosphere can be provided with that constituent so as to minimize its evaporation from the substrate while the substrate is heating. For example, phosphine gas can be introduced to minimize phosphorus evaporation from an InP substrate. Furthermore, an etchant gas, such as HCl, could be introduced into the preheat zone atmosphere if it was desired to etch the surface of the substrate prior to deposition.

After both the reactant gases 48 and substrate have reached equilibrium, the substrate is moved into the deposition zone by again sliding the rod an appropriate distance. Epitaxial deposition occurs within the deposition zone, and when the desired thickness has been achieved, the substrate can be removed by withdrawing the rod 20, allowing the substrate to cool, and breaking the seal between the bearing/plug assembly and the assembly tube.

Throughout the deposition sequence, residues are deposited on all apparatus surfaces contacted by the reactant gases. Residues are deposited on the inside walls of the reactor tube 14 up to the point of the jacket 32. Additionally, residues are deposited on the outside surface of the unjacketed portion of the assembly tube 16; throughout the jacket passageway 34 and vent 36; on the rod 20; and on the substrate holder 22. These residues become a source of contamination in subsequent depositions. For example, when a subsequent deposition requires a high purity gallium arsenide epitaxial film, having less than $10^{14}$ carriers/cm$^3$, it may be necessary to clean the apparatus between every deposition cycle. The apparatus 10 of the present invention greatly facilitates this cleaning.

As previously indicated, portions of the apparatus 10 within the furnace 12 can be cleaned conventionally by heating the furnace and passing HCl gas through the heated portion of the reactor tube. As with conventional reactors, those portions of the apparatus 10 which extend beyond the furnace 12 cannot be cleaned in this manner because they cannot readily be heated to the cleaning temperature. However, with the apparatus 10 all contaminated portions can be effectively cleaned by merely disassembling the assembly tube 16 from the reactor tube 14 at the plug 26, and immersing the assembly tube in a solution which will dissolve the residues. In actual operation, a second assembly tube can be provided, for use when the first assembly tube is being cleaned, so as to reduce downtime of the apparatus.

Thus, in the present invention, all deposited residues can be readily cleaned. The counterflowing gas 50 through the reactor/assembly tube channel 40 prevents residue from depositing on the reactor tube inside wall in the channel 40 portion. All residues that are deposited on the reactor tube 14 are deposited on that portion of the tube which is surrounded by the furnace and can thus readily be cleaned.

The apparatus 10 is preferably fabricated from quartz tubing and the furnace 12 might incorporate conventional resistance heaters or heat pipes. The physical dimensions of the apparatus are largely a function of the size of the substrate to be used. The length of the jacket 32 should be such that it extends into the preheat zone to a point which can be heated to the reactor tube cleaning temperature, and it should be displaced from the first end 28 of the assembly tube such that counterflowing gas 50 in the reactor/assembly tube channel 40 does not disturb the gas flow in the deposition zone. It should be clear that various modifications to the bearing/plug assembly and reactor tube end as well as to the various gas inlets and vents may be made without departing from the scope of the invention. For example, although the apparatus has been described in terms of substantially cylindrical components, coaxially mounted components having other shapes would be equivalent.

What is claimed is:

1. A vapor phase deposition apparatus, comprising:
a reactor tube, having an open end;

means for heating a portion of the reactor tube which is displaced from said open end;

a jacketed assembly tube, having first and second open ends and being movable to a position which is coaxial within said reactor tube, such that when it is in said coaxial position; the first end of the assembly tube is within the heated portion of the reactor tube, the second end of the assembly tube extends from the open end of the reactor tube, and the assembly tube forms an annular channel with the reactor tube;

means for sealing said channel, in proximity to the open end of the reactor tube and the second end of the assembly tube;

a reactor tube gas inlet, in proximity to the open end of the reactor tube, providing a passage to said channel;

a vent, providing a passage to the jacketed portion of the assembly tube in proximity to the second end of the assembly tube;

an assembly tube gas inlet, providing a passage to a central portion of the assembly tube;

a bearing/plug assembly, mountable so as to seal the second end of the assembly tube; and a rod, having a substrate holder on the end thereof, said rod being slidably mounted within the bearing assembly such that the substrate holder is movable, within the central portion of the assembly tube, from a position in proximity to the second end of the assembly tube to a position within the heated portion of the reactor tube.

2. An apparatus in accordance with claim 1, wherein the open end of the reactor tube is flared.

3. An apparatus in accordance with claim 2, wherein the means for sealing the channel between the reactor tube and assembly tube comprises a plug which coaxially surrounds the assembly tube.

4. An apparatus in accordance with claim 1, wherein the second end of the assembly tube is flared.

5. An apparatus in accordance with claim 1, wherein the bearing/plug assembly is substantially frustum-shaped and includes a pair of gas bearings.

6. An apparatus in accordance with claim 5, wherein the rod is coaxially mounted within the bearing/plug assembly.

7. An apparatus in accordance with claim 6, wherein the rod diameter necks down in proximity to the substrate holder.

8. An apparatus in accordance with claim 1, wherein the reactor tube, assembly tube, bearing/plug assembly, and rod are quartz.

9. An apparatus in accordance with claim 1, wherein the heating means comprises a resistance heater.

10. An apparatus in accordance with claim 1, wherein the heating means comprises a heat pipe.

* * * * *